(12) United States Patent
Udagawa

(10) Patent No.: US 11,962,126 B2
(45) Date of Patent: Apr. 16, 2024

(54) OVERCURRENT DETERMINATION CIRCUIT AND LIGHT EMISSION CONTROL APPARATUS

(71) Applicant: SONY CORPORATION, Tokyo (JP)

(72) Inventor: Toshiki Udagawa, Tokyo (JP)

(73) Assignee: SONY CORPORATION, Tokyo (JP)

( * ) Notice: Subject to any disclaimer, the term of this patent is extended or adjusted under 35 U.S.C. 154(b) by 779 days.

(21) Appl. No.: 17/041,084

(22) PCT Filed: Mar. 25, 2019

(86) PCT No.: PCT/JP2019/012297
§ 371 (c)(1),
(2) Date: Sep. 24, 2020

(87) PCT Pub. No.: WO2019/193997
PCT Pub. Date: Oct. 10, 2019

(65) Prior Publication Data
US 2021/0104868 A1 Apr. 8, 2021

(30) Foreign Application Priority Data
Apr. 3, 2018 (JP) .................................. 2018-071655

(51) Int. Cl.
*H04N 9/31* (2006.01)
*H01S 5/042* (2006.01)
(Continued)

(52) U.S. Cl.
CPC .......... *H01S 5/06825* (2013.01); *H02H 3/08* (2013.01); *H02H 7/20* (2013.01); *H04N 9/312* (2013.01);
(Continued)

(58) Field of Classification Search
CPC ............... H01S 5/06825; H01S 5/0428; H01S 5/06216; H01S 5/4093; H01S 5/4025;
(Continued)

(56) References Cited

U.S. PATENT DOCUMENTS 4,710,779 A * 12/1987 Funaki ................. H04N 1/4005
358/300
4,761,659 A * 8/1988 Negishi .............. G06K 15/1214
347/246
(Continued)

FOREIGN PATENT DOCUMENTS

CA 2516485 A1 9/2004
CN 1910813 A 2/2007
(Continued)

OTHER PUBLICATIONS

International Search Report and Written Opinion of PCT Application No. PCT/JP2019/012297, dated Jun. 4, 2019, 11 pages of ISRWO.

*Primary Examiner* — M. A. Golub-Miller
(74) *Attorney, Agent, or Firm* — CHIP LAW GROUP

(57) ABSTRACT

[Object] To provide a technology capable of appropriately determining whether overcurrent has flowed in a light emitting element even in a case where the light emitting element is driven by the pulse driving method. [Solving Means] An overcurrent determination circuit according to the present technology includes: a sample-and-hold circuit that obtains a driving current value of a light emitting element in accordance with a timing of a light emitting interval of the light emitting element that emits pulsed light; and a comparator circuit that compares the obtained driving current value with a value of a predetermined determination level and determines whether overcurrent has flowed in the light emitting element.

13 Claims, 7 Drawing Sheets

(51) Int. Cl.
*H01S 5/068* (2006.01)
*H01S 5/40* (2006.01)
*H02H 3/08* (2006.01)
*H02H 7/20* (2006.01)
*H01S 5/062* (2006.01)

(52) U.S. Cl.
CPC ......... *H04N 9/3155* (2013.01); *H04N 9/3161* (2013.01); *H04N 9/3164* (2013.01); *H01S 5/0428* (2013.01); *H01S 5/06216* (2013.01); *H01S 5/06804* (2013.01); *H01S 5/06808* (2013.01); *H01S 5/4093* (2013.01)

(58) Field of Classification Search
CPC . H01S 5/042; H02H 3/08; H02H 7/20; H04N 9/3155; H04N 9/3161; H04N 9/3164; H04N 9/312
See application file for complete search history.

(56) References Cited

U.S. PATENT DOCUMENTS

| | | | | |
|---|---|---|---|---|
| 4,796,250 | A * | 1/1989 | Kobayashi | G11B 11/10543 369/53.26 |
| 6,154,292 | A * | 11/2000 | Motoi | H04N 1/047 358/475 |
| 2005/0135440 | A1 * | 6/2005 | Ikeda | H01S 5/042 372/38.07 |
| 2005/0185428 | A1 | 8/2005 | Crawford et al. | |
| 2005/0237680 | A1 * | 10/2005 | Egner | H02H 3/20 361/42 |
| 2009/0230292 | A1 * | 9/2009 | Koyama | H02H 9/04 250/214 R |
| 2014/0077724 | A1 * | 3/2014 | Sawada | H05B 45/385 315/307 |
| 2016/0045185 | A1 * | 2/2016 | Nakatsuka | A61B 8/4416 600/443 |
| 2016/0058291 | A1 * | 3/2016 | Nakatsuka | H05B 45/37 600/407 |
| 2016/0058292 | A1 * | 3/2016 | Nakatsuka | A61B 5/0095 600/407 |
| 2021/0176849 | A1 * | 6/2021 | Wang | H02H 3/202 |
| 2022/0053624 | A1 * | 2/2022 | Kendle | H05B 45/56 |

FOREIGN PATENT DOCUMENTS

| | | |
|---|---|---|
| CN | 101964595 A | 2/2011 |
| CN | 107408892 A * | 11/2017 |
| JP | 61-254866 A | 11/1986 |
| JP | H07183781 A | 7/1995 |
| JP | 08-340144 A | 12/1996 |
| JP | 2003-150089 A | 5/2003 |
| JP | 2004274305 A | 9/2004 |
| JP | 2007-129862 A | 5/2007 |
| JP | 2008283498 A | 11/2008 |
| JP | 2011-009366 A | 1/2011 |
| JP | 2011-129842 A | 6/2011 |
| JP | 2012-70110 A | 4/2012 |
| JP | 2016-047079 A | 4/2016 |
| WO | 2004/075145 A1 | 9/2004 |

* cited by examiner

OVERCURRENT DETERMINATION CIRCUIT AND LIGHT EMISSION CONTROL APPARATUS

CROSS REFERENCE TO RELATED APPLICATIONS

This application is a U.S. National Phase of International Patent Application No. PCT/JP2019/012297 filed on Mar. 25, 2019, which claims priority benefit of Japanese Patent Application No. JP 2018-071655 filed in the Japan Patent Office on Apr. 3, 2018. Each of the above-referenced applications is hereby incorporated herein by reference in its entirety.

TECHNICAL FIELD

The present technology relates to a technology such as an overcurrent determination circuit that determines overcurrent that flows in a light emitting element.

BACKGROUND ART

When overcurrent flows in a light emitting element such as a laser element and light having intensity higher than that required is output, there is a possibility that the light emitting element may be damaged.

In order to prevent it, a laser output apparatus is provided with an overcurrent protection apparatus in Patent Literature 1 below. This overcurrent protection apparatus monitors a value of current supplied to the laser output apparatus and blocks the current when overcurrent flows.

CITATION LIST

Patent Literature

Patent Literature 1: Japanese Patent Application Laid-open No. 2012-70110

DISCLOSURE OF INVENTION

Technical Problem

In the technology described in Patent Literature 1, there is a problem in that it is impossible to appropriately determine whether overcurrent has flowed in the light emitting element in a case where the light emitting element is driven by the pulse driving method.

In view of the above-mentioned circumstances, it is an object of the present technology to provide a technology capable of appropriately determining whether overcurrent has flowed in a light emitting element even in a case where the light emitting element is driven by the pulse driving method.

Solution to Problem

An overcurrent determination circuit according to the present technology includes: a sample-and-hold circuit that obtains a driving current value of a light emitting element in accordance with a timing of a light emitting interval of the light emitting element that emits pulsed light; and a comparator circuit that compares the obtained driving current value with a value of a predetermined determination level and determines whether overcurrent has flowed in the light emitting element.

Accordingly, it is possible to appropriately determine whether overcurrent has flowed in the laser element even in a case where the laser element is driven by the pulse driving method.

In the overcurrent determination circuit, the value of the determination level may be changed depending on a temperature around the light emitting element.

In the overcurrent determination circuit, the value of the determination level may be changed such that the value becomes higher as the temperature becomes higher.

In the overcurrent determination circuit, the value of the determination level may be set in accordance with a maximum rated light output of the light emitting element.

In the overcurrent determination circuit, the comparator circuit may determine whether overcurrent based on overshoot of the driving current has flown by the comparison.

In the overcurrent determination circuit, driving of the light emitting element may be stopped in a case where it is determined by the comparator circuit that the overcurrent has flowed in the light emitting element.

In the overcurrent determination circuit, the comparator circuit may output, in a case where it is determined that the overcurrent has flowed in the light emitting element, a detection signal indicating that the overcurrent has been detected.

The overcurrent determination circuit may further include a signal output circuit that outputs, when at least one signal of the detection signal output from the comparator circuit and a stop control signal for stopping driving of the light emitting element is input, a stop signal for stopping driving of the light emitting element to a driving circuit that drives the light emitting element, the stop control signal being output from a controller that performs processing related to light emission control.

In the overcurrent determination circuit, the light emitting element may include a first light emitting element and a second light emitting element that output light in wavelength regions different from each other and emit light at timings different from each other, the overcurrent determination circuit including a first overcurrent determination circuit corresponding to the first light emitting element and a second overcurrent determination circuit corresponding to the second light emitting element.

In the overcurrent determination circuit, the first overcurrent determination circuit may include a first sample-and-hold circuit that obtains a driving current value of the first light emitting element in accordance with a timing of a light emitting interval of the first light emitting element and a first comparator circuit that compares the obtained driving current value with the value of the determination level and determines whether overcurrent has flowed in the first light emitting element.

In the overcurrent determination circuit, the second overcurrent determination circuit may include a second sample-and-hold circuit that obtains a driving current value of the second light emitting element in accordance with a timing of a light emitting interval of the second light emitting element and a second comparator circuit that compares the obtained driving current value with the value of the determination level and determines whether overcurrent has flowed in the second light emitting element.

In the overcurrent determination circuit, the first comparator circuit may output, in a case where it is determined that the overcurrent has flowed in the first light emitting element, a first detection signal indicating that the overcurrent has been detected, and the second comparator circuit may output, in a case where it is determined that the overcurrent has flowed in the second light emitting element, a second detection signal indicating that the overcurrent has been detected.

The overcurrent determination circuit may further include a signal output circuit that outputs, when at least one signal of the first detection signal and the second detection signal is input, a signal indicating that the overcurrent has been detected in at least one light emitting element to a controller that performs processing related to light emission control.

In the overcurrent determination circuit, the overcurrent determination circuit may be configured as an independent circuit different from a controller that performs processing related to light emission control.

A light emission control apparatus according to the present technology includes a light emitting element and an overcurrent determination circuit.

The light emitting element emits pulsed light.

The overcurrent determination circuit includes a sample-and-hold circuit that obtains a driving current value of the light emitting element in accordance with a timing of a light emitting interval of the light emitting element and a comparator circuit that compares the obtained driving current value with a value of a predetermined determination level and determines whether overcurrent has flowed in the light emitting element.

Advantageous Effects of Invention

As described above, in accordance with the present technology, it is possible to provide a technology capable of appropriately determining whether overcurrent has flowed in a light emitting element even in a case where the light emitting element is driven by the pulse driving method.

MODE(S) FOR CARRYING OUT THE INVENTION

Hereinafter, embodiments according to the present technology will be described with reference to the drawings.

<Overall Configuration and Respective Blocks of Projector 100>

Figure 1:
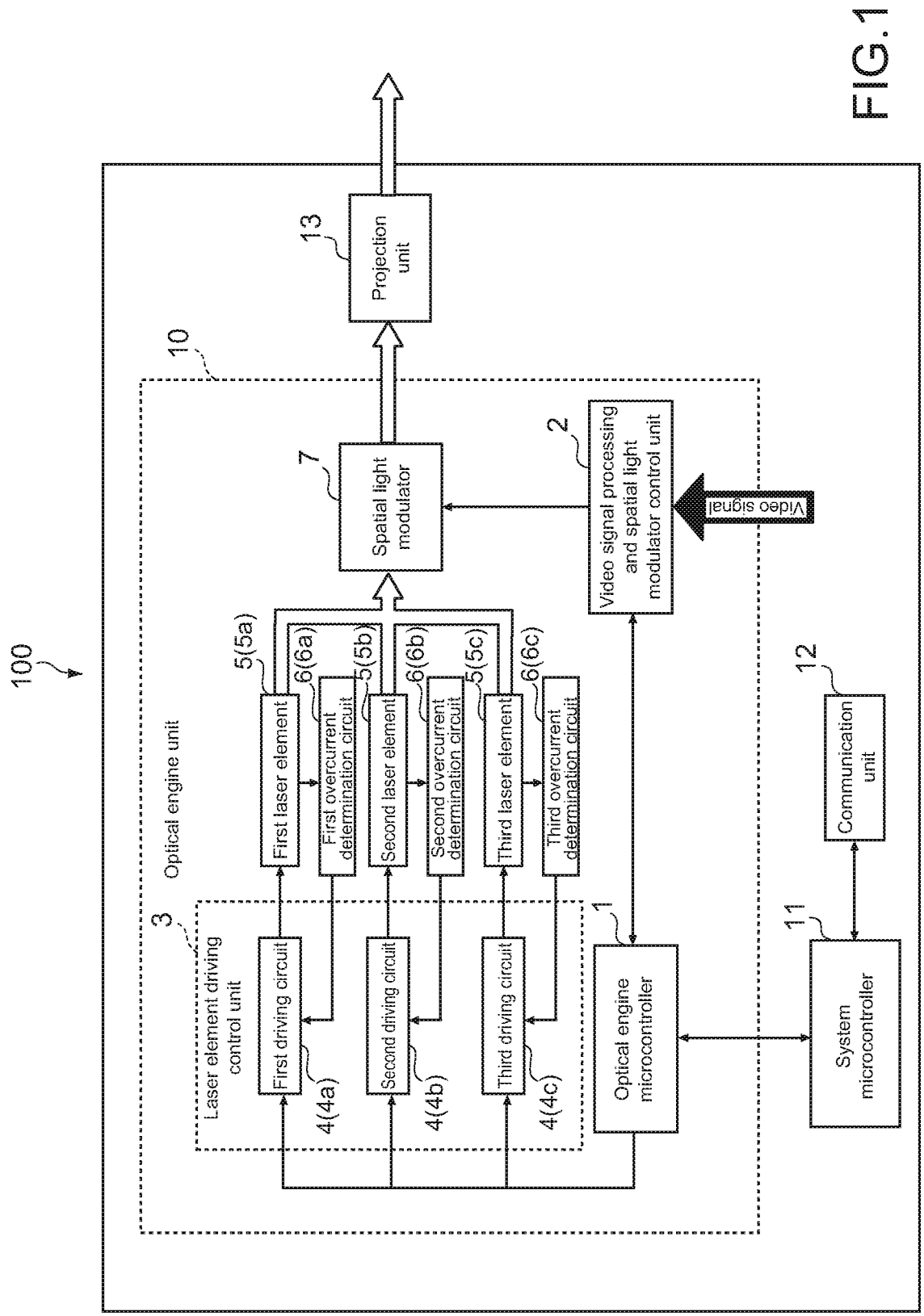
FIG. 1 A block diagram showing a projector according to an embodiment of the present technology.

FIG. 1 is a block diagram showing a projector 100 according to an embodiment of the present technology. In FIG. 1, the solid arrow indicates transmission and reception (or supply of power) of a signal and the white arrow indicates the travel of light.

As shown in FIG. 1, the projector 100 includes a system microcontroller 11 (hereinafter, simply referred to as system controller 11), a communication unit 12, an optical engine unit 10, and a projection unit 13.

The system controller 11 comprehensively controls the respective blocks of the projector 100. The system controller 11 includes a central processing unit (CPU) core, a volatile memory used as a work area of the CPU core, and a nonvolatile memory in which various programs necessary for processing of the CPU core are stored.

The various programs described above may be read from a portable recording medium such as an optical disc and a semiconductor memory or may be downloaded from a server device over a network (the same applies to programs in the engine controller 1 and the spatial light modulator control unit 2 to be described later).

The communication unit 12 is configured to be communicable with other apparatuses (e.g., server device) other than the projector 100.

The optical engine unit 10 (light emission control apparatus) includes an optical engine microcontroller 1 (hereinafter, simply referred to as engine controller 1), a video signal processing and spatial light modulator control unit (hereinafter, simply referred to as spatial light modulator control unit 2), and a laser element driving control unit 3.

Further, the optical engine unit 10 includes a first laser element 5a (first light emitting element), a second laser element 5b (second light emitting element), and a third laser element 5c (third light emitting element). Further, the optical engine unit 10 includes a first overcurrent determination circuit 6a, a second overcurrent determination circuit 6b, a third overcurrent determination circuit 6c, and a spatial light modulator 7.

It should be noted that in the following description, if the first laser element 5a, the second laser element 5b, and the third laser element 5c are not specifically distinguished, those will be simply referred to as the laser elements 5. Similarly, if the first overcurrent determination circuit 6a, the second overcurrent determination circuit 6b, and the third overcurrent determination circuit 6c are not specifically distinguished, those will be simply referred to as overcurrent determination circuits 6 (the same applies to driving circuits 4, sample-and-hold circuits 30, comparison circuits 40, signal output circuits 50, and the like to be described later).

The engine controller 1 includes a CPU core, a volatile memory used as a work area of the CPU core, and a nonvolatile memory in which various programs necessary for processing of the CPU core are stored.

The engine controller 1 receives luminance information based on a video signal from the system controller 11. Further, the engine controller 11 receives, from the spatial light modulator control unit 2, timing information indicating what the timing for turning on/off the three laser elements 5 is. Then, the engine controller 1 generates, on the basis of the luminance information, driving information (information about a driving current value) for making the three laser elements 5 emit light at predetermined intensity and outputs this driving information and the timing information to the laser element driving control unit 3. Further, the engine controller 1 outputs information about setting values of various parameters (video parameters) relating to display quality of the video to the spatial light modulator unit 2.

The laser element driving control unit 3 generates, on the basis of the driving information and the timing information, a signal for making the laser output light having required intensity at a required timing. Then, the laser element driving control unit 3 sequentially transmits this signal to the respective laser elements 5 (sequentially supplies a pulsed driving current value) and makes the respective laser elements 5 respectively output light, such that the luminance and white balance of the video meet required specifications.

The laser element driving control unit 3 includes a first driving circuit 4a corresponding to the first laser element 5a, a second driving circuit 4b corresponding to the second laser element 5b, and a third driving circuit 4c corresponding to the third laser element 5c. These driving circuits 4 have similar configurations.

The first driving circuit 4a supplies pulsed driving current to the first laser element 5a and makes the first laser element 5a output light having required intensity at a required timing. Similarly, the second driving circuit 4b supplies pulsed driving current to the second laser element 5b and makes the second laser element 5b output light having required intensity at a required timing. Similarly, the third driving circuit 4c supplies pulsed driving current to the third laser element 5c and makes the third laser element 5c output light having required intensity at a required timing.

The first laser element 5a, the second laser element 5b, and the third laser element 5c are made to emit pulsed light on the basis of the signal (pulsed driving current) from the laser element driving control unit 3.

The three laser elements 5 output light in wavelength regions different from one another. In the present embodiment, the first laser element 5a outputs light in a wavelength region corresponding to red, the second laser element 5b outputs light in a wavelength region corresponding to green, and the third laser element 5c outputs light in a wavelength region corresponding to blue.

Further, the three laser elements 5 are made to emit light at different timings different from one another in the pulse driving method (driving method of repeating turning on/off in a short period by pulsed driving current).

Figure 2:
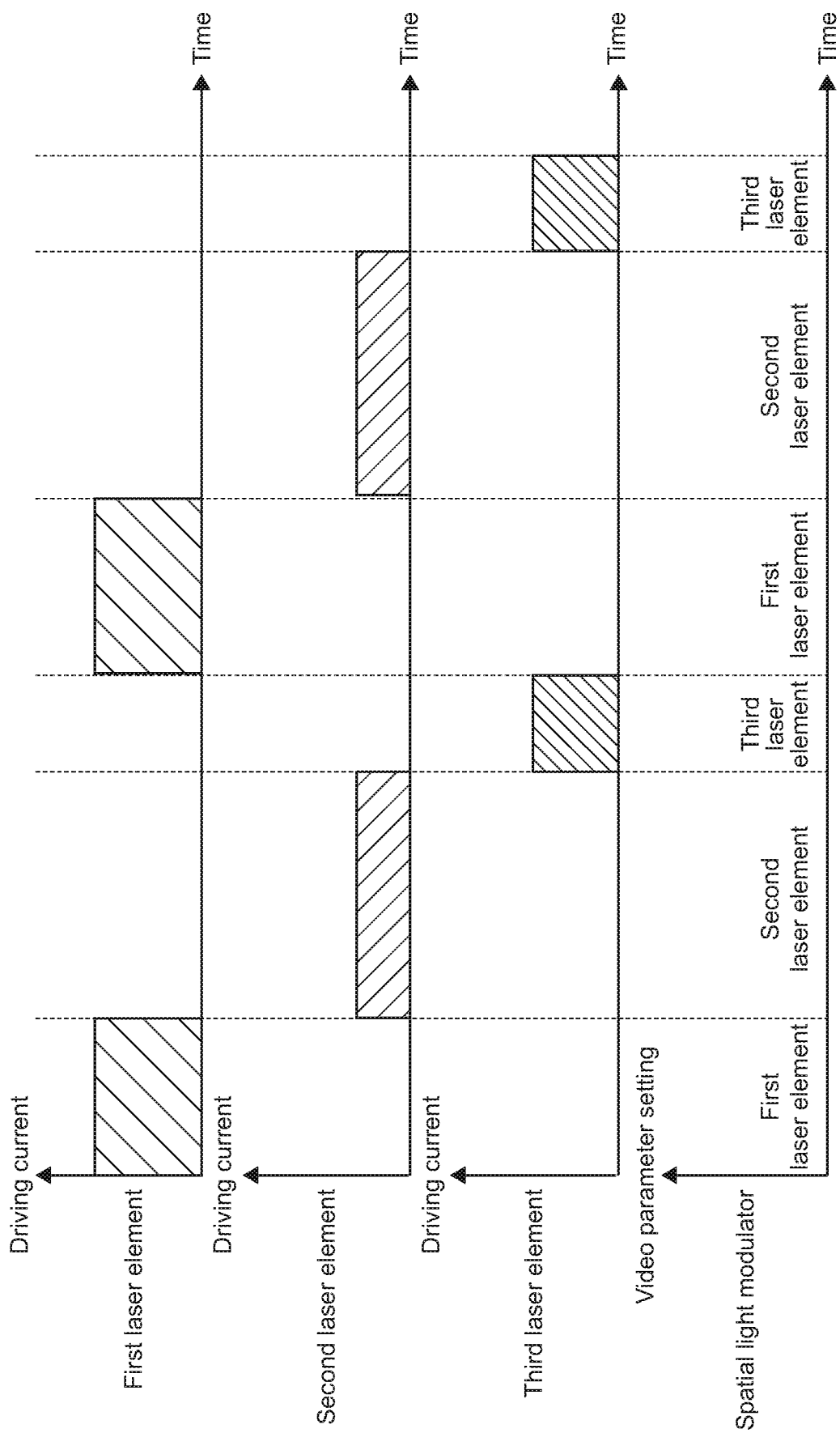
FIG. 2 A diagram showing light emission timings by a first laser element, a second laser element, and a third laser element.

FIG. 2 is a diagram showing light emission timings of the first laser element 5a, the second laser element 5b, and the third laser element 5c. As shown in FIG. 2, the three laser elements 5 are supplied with pulsed driving current at timings different from one another and the three laser elements 5 emit light at intensity corresponding to the driving current value only while the three laser elements 5 are being supplied with the driving current.

That is, in the present embodiment, the timing at which the three laser elements 5 emit light is set to timings different from one another by time division, and basically, two or more laser elements 5 of the three laser elements 5 do not emit light at the same timing.

The order in which the laser elements 5 emit light is set in advance (in the example shown in FIG. 2, the first laser element 5a (red)→second laser element 5b (green)→third laser element 5c (blue)) and the laser elements 5 repeats turning on/off in this order in a certain cycle.

In the example shown in FIG. 1, a case where one laser element 5 is provided for one driving circuit 4 is shown. On the other hand, two or more laser elements 5 for the same wavelength region may be provided in one driving circuit 4.

Although not shown in FIG. 1, a temperature sensor is provided in the vicinity of each of the first laser element 5a, the second laser element 5b, and the third laser element 5c. This temperature sensor detects the temperature around the laser element 5 and outputs information about the detected temperature to the system controller 11 (or the engine controller 1). It should be noted that the laser element 5 can change in temperature due to heat generation of the laser element 5 itself, the external temperature, and the like.

The overcurrent determination circuit 6 includes a first overcurrent determination circuit 6a corresponding to the first laser element 5a, a second overcurrent determination circuit 6b corresponding to the second laser element 5b, and a third overcurrent determination circuit 6c corresponding to the third laser element 5c.

The first overcurrent determination circuit 6a determines whether overcurrent has flowed in the first laser element 5a. Then, in a case where it is determined that the overcurrent has flowed in the first laser element 5a, the first overcurrent determination circuit 6a outputs a signal for stopping the first driving circuit 4a to the first driving circuit 4a and immediately stops the driving of the first laser element 5a by the first driving circuit 4a.

Similarly, the second overcurrent determination circuit 6b determines whether overcurrent has flowed in the second laser element 5b. Then, in a case where it is determined that the overcurrent has flowed in the second laser element 5b, the second overcurrent determination circuit 6b outputs a signal for stopping the second driving circuit 4b to the second driving circuit 4b and immediately stops the driving of the second laser element 5b by the second driving circuit 4b.

Similarly, the third overcurrent determination circuit 6c determines whether overcurrent has flowed in the third laser element 5c. Then, in a case where it is determined that the overcurrent has flowed in the third laser element 5c, the third overcurrent determination circuit 6c outputs a signal for stopping the third driving circuit 4c to the third driving circuit 4c and immediately stops the driving of the third laser element 5c by the third driving circuit 4c.

A specific configuration in the overcurrent determination circuit 6 will be described later in detail with reference to FIG. 3.

The spatial light modulator control unit 2 includes a CPU core, a volatile memory used as a work area of the CPU core, and a nonvolatile memory in which various programs and the like necessary for processing of the CPU core are stored.

The spatial light modulator control unit 2 inputs a video signal (e.g., directly from the storage unit that stores the video signal, the communication unit 12, or the like) and processes this video signal. The spatial light modulator control unit 2 extracts the information necessary for driving the spatial light modulator 7 (e.g., the driving voltage in the liquid crystal, the driving timing, etc.) from the video signal and outputs to the spatial light modulator 7. Further, the spatial light modulator control unit 2 sets the characteristics (video parameters: various parameters relating to the display video quality of the video) of the spatial light modulator 7 required from the system controller 11 via the engine controller 1 and drives the spatial light modulator 7 in accordance with the video signal.

Further, the spatial light modulator control unit 2 outputs timing information indicating which laser element 5 is to be turned on/off and what the timing for turning it on/off is and outputs the timing information to the laser element driving control unit 3 via the engine controller 1.

On the lower side of FIG. 2, a relationship between a video parameter set in the spatial light modulator control unit 2 and the laser element 5 is shown.

As shown on the lower side of FIG. 2, video parameters of the spatial light modulator 7 are set such that color components (red) of the first laser element 5a reflect each component such as the spatial light modulator 7 in a light beam passage area in an interval in which the first laser element 5a emits light.

Similarly, video parameters of the spatial light modulator 7 are set such that color components (green) of the second laser element 5b reflect each component such as the spatial light modulator 7 in a light beam passage area in an interval in which the second laser element 5b emits light. Similarly, the video parameters of the spatial light modulator 7 are set such that color components (blue) of the third laser element 5c reflect each component such as the spatial light modulator 7 in a light beam passage area in an interval in which the third laser element 5c emits light.

That is, in the spatial light modulator control unit 2, the video parameters of the spatial light modulator 7 are sequentially switched for each interval in which each laser element 5 emits light.

Here, assuming that a period from a point of time at which the first laser element 5a is turned on to a point of time at which the third laser element 5c is turned off is defined as one cycle, this cycle is set to be equal to the frame rate of the video signal or an integral multiple of the frame rate. In this case, the timing synchronization is easily achieved in the video signal processing at the spatial light modulator control unit 2.

The spatial light modulator 7 includes a liquid crystal, various mirrors, various lenses and the like. This spatial light modulator 7 performs spatial light modulation on light output from the three laser elements 5 in accordance with the video parameters. In the spatial light modulator 7, a red-component image, a green-component image, and a blue-component image of three-primary-color separation are repeatedly generated in accordance with the video signal.

When the red-component image, the green-component image, and the blue-component image are repeatedly generated at a relatively high speed, it generally appears to the human eye that the original video signal color synthesized is reproduced. In the present embodiment, the pulse driving method is a driving method using this relationship.

The projection unit 13 projects light emitted from the spatial light modulator 7 to a projection target such as a screen. This projection unit 13 includes a cylindrical, tubular body and a plurality of lenses provided inside the tubular body.

The projector 100 may include an automatic power control (APC) system. The APC system is a system for automatically keeping intensity of light of the laser element 5 constant even if the temperature of the laser element 5 changes.

In the APC system, a photodetector including a light receiving element in an optical path through which light from the laser element 5 passes is disposed. This photodetector measures intensity of light actually output from the laser element 5. Then, in the APC system, a difference between the measured intensity of light and target intensity of light is calculated and the intensity of light of the laser element 5 is adjusted to eliminate this difference.

<Overcurrent Determination Circuit 6>

Next, the overcurrent determination circuit 6 will be described in detail. It should be noted that the first overcurrent determination circuit 6a, the second overcurrent determination circuit 6b, and the third overcurrent determination circuit 6c have similar configurations, and thus the first overcurrent determination circuit 6a will be described as a representative hereinafter. FIG. 3 is a diagram showing a first driving circuit 4a and a first overcurrent determination circuit 6a.

First of all, referring to FIG. 3, the first driving circuit 4a will be described (the second driving circuit 4b and the third driving circuit 4c have configurations similar to that of the first driving circuit 4a). It should be noted that in FIG. 3, the first driving circuit 4a is simplified and only a part thereof is shown.

Figure 3:
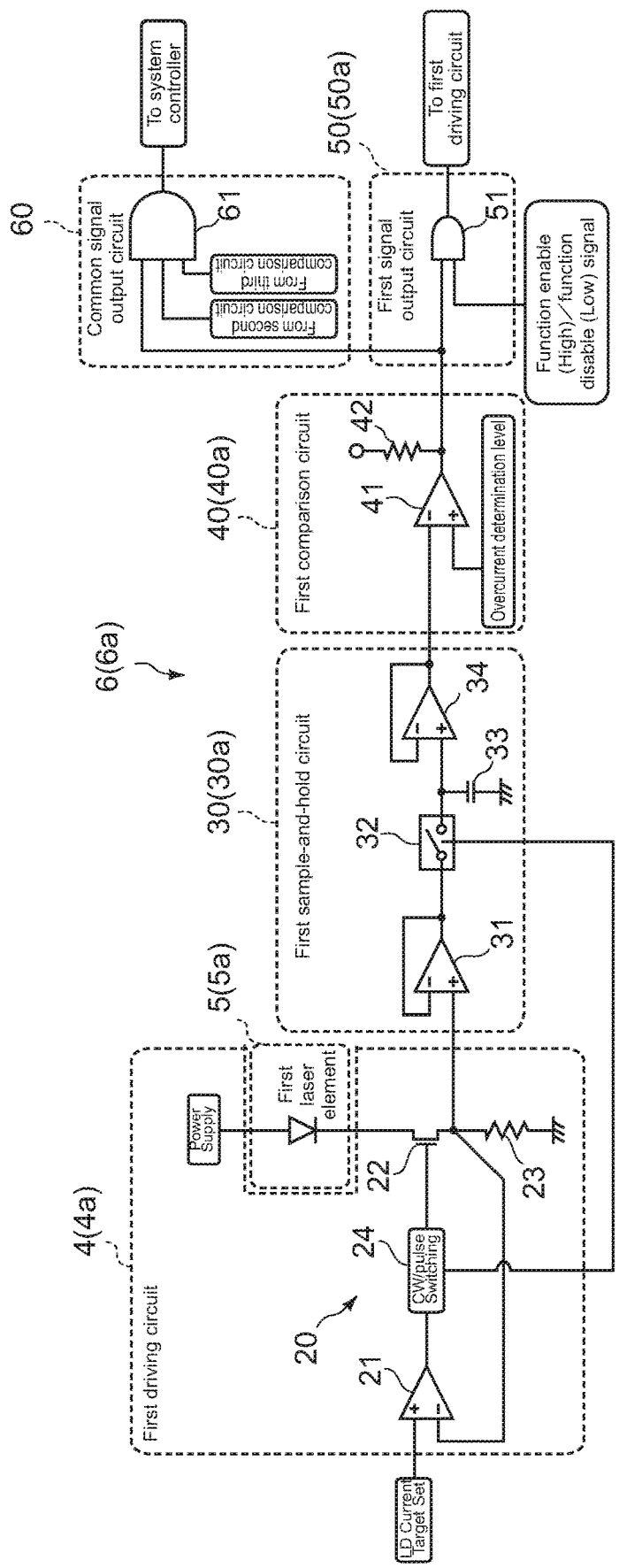
FIG. 3 A diagram showing a first driving circuit and a first overcurrent determination circuit.

As shown in FIG. 3, the first driving circuit 4a includes a constant-current circuit 20. This constant-current circuit 20 is a mechanism for flowing constant current in the first laser element 5a. The constant-current circuit 20 shown in FIG. 3 is a so-called sink-type constant-current circuit. On the other hand, another system of source-type or the like may be used for the constant-current circuit.

The constant-current circuit 20 includes an operational amplifier 21, a field-effect transistor 22, and a grounded resistor 23.

When a voltage value corresponding to a target driving current value is input in a non-inverting input terminal (+) of the operational amplifier 21, this constant-current circuit 20 is configured such that current corresponding to the target driving current value constantly flows in the first laser element 5a.

A switching element 24 capable of switching a continuous wave (CW) driving method (driving method for making the laser element 5 continuously emit light) and a pulse driving method to each other is provided between the operational amplifier 21 and the field-effect transistor 22. That is, the projector 100 according to the present embodiment is configured to switch the CW driving method and the pulse driving method to each other. It should be noted that it is assumed that the projector 100 according to the present embodiment is driven by the pulse driving method unless otherwise stated.

In a case of the pulse driving method, the switching element 24 is turned "ON" at a timing of a light emitting interval of the first laser element 5a and supplies a high-level voltage to the field-effect transistor 22 at the subsequent stage. When the high-level voltage is supplied to the field-effect transistor 22, the field-effect transistor 22 is turned "ON" and current flows in the first laser element 5a. It should be noted that the high-level voltage causes the field-effect transistor 22 to operate such that the driving current value of the first laser element 5a finally becomes the target driving current value.

Further, in a case of the pulse driving method, the switching element 24 is turned "OFF" at a timing of a non-light emitting interval of the first laser element 5a and supplies a low-level voltage to the field-effect transistor 22 at the subsequent stage. When the low-level voltage is supplied to the field-effect transistor 22, the field-effect transistor 22 is turned "OFF". In this case, no current flows in the first laser element 5a.

It should be noted that timing information indicating a light emitting interval in which the first laser element 5a is made to emit light (timing information indicating what the timing for turning it on/off is) is received from the spatial light modulator control unit 2.

On the other hand, in a case of the CW driving method, the light emitting interval is constant, and thus the switching element 24 constantly supplies a high-level voltage to the field-effect transistor 22 at the subsequent stage. In this case, the field-effect transistor is constantly turned "ON" and current constantly flows in the first laser element 5a.

The first overcurrent determination circuit 6a includes a first sample-and-hold circuit 30a, a first comparison circuit 40a, and a first signal output circuit 50a. It should be noted that although the illustration will be omitted, the second overcurrent determination circuit 6b includes a second sample-and-hold circuit 30, a second comparison circuit 40, and a second signal output circuit 50. Further, the third overcurrent determination circuit 6c includes a third sample-and-hold circuit 30, a third comparison circuit 40, and a third signal output circuit 50.

The three sample-and-hold circuits 30 have similar configurations and the three comparison circuits 40 also have similar configurations. Further, the three signal output circuits 50 have similar configurations.

[Sample-And-Hold Circuit 30]

The first sample-and-hold circuit 30a obtains the driving current value of the first laser element 5a in accordance with the timing (see FIG. 2) of the light emitting interval of the first laser element 5a that is made to emit pulsed light. This first sample-and-hold circuit 30a continues to continuously obtain the driving current value of the first laser element 5a while the first laser element 5a is emitting light in the light emitting interval.

Similarly, the second sample-and-hold circuit 30 obtains the driving current value of the second laser element 5b in accordance with a timing of a light emitting interval of the second laser element 5b that is made to emit pulsed light. This second sample-and-hold circuit 30 continues to continuously obtain the driving current value of the second laser element 5b while the second laser element 5b is emitting light in the light emitting interval.

Similarly, the third sample-and-hold circuit 30 obtains the driving current value of the third laser element 5c in accordance with a timing of a light emitting interval of the third laser element 5c that is made to emit pulsed light. This third sample-and-hold circuit 30 continues to continuously obtain the driving current value of the third laser element 5c while the third laser element 5c is emitting light in the light emitting interval.

It should be noted that although the "voltage value" is used rather than the "current value" in the specific embodiment shown in FIG. 3, and using the "current value" is equivalent to using the "voltage value".

As shown in FIG. 3, the first sample-and-hold circuit 30a includes a current detecting operational amplifier 31, a switching element 32, a grounded capacitor 33, and a holding operational amplifier 34.

The current detecting operational amplifier 31 detects the driving current value of current flowing through the first laser element 5a (this value is substantially equal to the current value of current flowing through the resistor 23 in the constant-current circuit 20) and buffers it.

The voltage value between the terminals at the resistor 23 in the constant-current circuit 20 is input in a non-inverting input terminal (+) of the current detecting operational amplifier 31. Further, the voltage value output from the output terminal of the current detecting operational amplifier 31 is input in an inverting input terminal (−) of the current detecting operational amplifier 31.

The switching element 32 operates differently in the CW driving method and the pulse driving method. In a case of the CW driving method, the switching element 32 is constantly turned ON. On the other hand, in a case of the pulse driving method, the switching element 32 is turned ON only in the light emitting interval of the laser element 5 (interval from the supply of the driving current is started until it is stopped: see FIG. 2) and is turned OFF in the non-light emitting interval.

The capacitor 33 maintains the charge at the moment when the switching element 32 is turned OFF.

The holding operational amplifier 34 holds the voltage value at the moment when the switching element is turned OFF. When the switching element 32 is ON, the voltage value output from the output terminal of the current detecting operational amplifier 31 (voltage value between the terminals at the resistor 23 in the constant-current circuit 20) is input in the non-inverting input terminal (+) of the holding operational amplifier 34.

On the other hand, when the switching element 32 is OFF, the voltage value at the moment when the switching element 32 is turned OFF continues to be applied on the non-inverting input terminal (+) of the holding operational amplifier 34 by the charge stored in the capacitor 33.

The voltage value output from the output terminal of the holding operational amplifier 34 is input in the inverting input terminal (−) of the holding operational amplifier 34.

When the switching element 32 is ON, the voltage value input in the non-inverting input terminal (+) of the current detecting operational amplifier 31 (voltage value between the terminals at the resistor 23 in the constant-current circuit 20) is output from the output terminal of the holding operational amplifier 34 as it is. On the other hand, when the switching element 32 is OFF, the voltage value at the moment (substantially at the moment) when the switching element 32 is turned OFF is output from the output terminal of the holding operational amplifier 34.

[Comparator Circuit 40]

The first comparison circuit 40a compares the driving current value obtained by the first sample-and-hold circuit 30a with a value of an overcurrent determination level to determine whether overcurrent has flowed in the first laser element 5a. Then, in a case where it is determined that the overcurrent has flowed in the first laser element 5a, the first comparison circuit 40a outputs a signal (low-level signal: first detection signal) indicating that the overcurrent has been detected.

Similarly, the second comparison circuit 40 compares the driving current value obtained by the second sample-and-hold circuit 30 with the value of the overcurrent determination level to determine whether the overcurrent has flowed in the second laser element 5b. Then, in a case where it is determined that the overcurrent has flowed in the second laser element 5b, the second comparison circuit 40 outputs a signal (low-level signal: second detection signal) indicating that the overcurrent has been detected.

Similarly, the third comparison circuit 40 compares the driving current value obtained by the third sample-and-hold circuit 30 with the value of the overcurrent determination level to determine whether the overcurrent has flowed in the third laser element 5c. Then, in a case where it is determined that the overcurrent has flowed in the third laser element 5c, the third comparison circuit 40 outputs a signal (low-level signal: third detection signal) indicating that the overcurrent has been detected.

As shown in FIG. 3, the first comparison circuit 40a includes a comparator 41 and a resistor 42.

The voltage value output from the output terminal of the hold operational amplifier 34 is input in the inverting input terminal (−) of the comparator 41. On the other hand, the overcurrent determination level (current value corresponding to the overcurrent. In a case of the example shown in FIG. 3, the value obtained by converting the current value corresponding to the overcurrent into the voltage value between the terminals of the resistor 23) is input in the non-inverting input terminal (+) of the comparator 41. It should be noted that the details of the overcurrent determination level will be described later with reference to FIGS. 4 and 5.

In a case where the voltage value output from the output terminal of the holding operational amplifier 34 (voltage value between the terminals at the resistor 23 in the constant-current circuit 20) is equal to or smaller than the value of the overcurrent determination level, a high-level signal (OK signal) is output from the output terminal of the comparator 41.

On the other hand, in a case where the voltage value output from the output terminal of the holding operational amplifier 34 (voltage value between the terminals at the resistor 23 in the constant-current circuit 20) is larger than the value of the overcurrent determination level, a low-level signal (NG signal: detection signal indicating that the overcurrent has been detected) is output from the output terminal of the comparator 41.

[Signal Output Circuit 50]

The first signal output circuit 50*a* outputs a stop signal (low-level signal) for stopping the driving of the first laser element 5*a* to the first driving circuit 4*a* under a predetermined condition.

Similarly, the second signal output circuit 50 outputs a stop signal (low-level signal) for stopping the driving of the second laser element 5*b* to the second driving circuit 4*b* under a predetermined condition.

Similarly, the third signal output circuit 50 outputs a stop signal (low-level signal) for stopping the driving of the third laser element 5*c* to the third driving circuit 4*c* under a predetermined condition.

As shown in FIG. 3, the first signal output circuit 50*a* includes an AND circuit 51. For the AND circuit 51, two input terminals are prepared. A high-level signal (OK signal) or a low-level signal (NG signal: detection signal indicating that the overcurrent has been detected) output from the output terminal of the comparator 41 is input in one of the input terminals.

A high-level signal (function enable signal) output from the system controller 11 or a low-level signal (function disable signal: stop control signal for stopping the driving of the first laser element 5*a*) is input in the other input terminal of the two input terminals. In this example, a case where the high-level signal or the low-level signal is output from the system controller 11 will be described, though this signal may be output from the engine controller 1.

In a case where the signal output from the output terminal of the comparator 41 is a high-level signal (OK signal) and the signal output from the system controller 11 is a high-level signal (function enable signal), the AND circuit 51 sends the high-level signal (function enable signal) to the first driving circuit 4*a* that drives the first laser element 5*a*.

On the other hand, in a case where at least one signal of the signal output from the output terminal of the comparator 41 and the signal output from the system controller 11 is a low-level signal (NG signal, function disable signal), the AND circuit 51 sends a low-level signal (function disable signal: stop signal for stopping the driving of the first laser element 5*a*) to the first driving circuit 4*a*.

The first driving circuit 4*a* is configured to immediately stop the driving of the first laser element 5*a* on the basis of this low-level signal.

The common signal output circuit 60 is connected in parallel to the first signal output circuit 50*a*. This common signal output circuit 60 outputs a signal indicating that the overcurrent has been detected in at least one laser element 5 of the three laser elements 5 under predetermined conditions to the system controller 11.

This common signal output circuit 60 is a circuit commonly used in the first overcurrent determination circuit 6*a*, the second overcurrent determination circuit 6*b*, and the third overcurrent determination circuit 6*c* and the single common signal output circuit 60 is provided for the three overcurrent determination circuits 6.

The common signal output circuit 60 includes an AND circuit 61. For the AND circuit 61, three input terminals are prepared and a high-level signal (OK signal) or a low-level signal (NG signal: first detection signal indicating that the overcurrent has been detected) output from the first comparison circuit 40*a* is input in a first input terminal.

A high-level signal (OK signal) output from the second comparison circuit 40 or a low-level signal (NG signal: second detection signal indicating that the overcurrent has been detected) is input in a second input terminal of the three input terminals. Further, a high-level signal output from the third comparison circuit 40 (OK signal) or a low-level signal (NG signal: third detection signal indicating that the overcurrent has been detected) is input in a third input terminal.

In a case where all signals of the signal output from the first comparator circuit 40*a*, the signal output from the second comparator circuit 40, and the signal output from the third comparator circuit 40 are high-level signals (OK signals), the AND circuit 61 sends a high-level signal (OK signal) to the system controller 11.

On the other hand, in a case where at least one signal of the signal output from the first comparator circuit 40*a*, the signal output from the second comparator circuit 40, and the signal output from the third comparator circuit 40 is a low-level signal (NG signal), the AND circuit 61 sends a low-level signal (NG signal: signal indicating that the overcurrent has been detected in at least one laser element 5 of the three laser elements 5) to the system controller 11.

When receiving this signal, the system controller 11 performs, for example, processing of restarting (resetting) the entire system or the like. Although in this example, the case where the signal from the common signal output circuit 60 is output to the system controller 11 has been described, this signal may be output to the engine controller 1 or may be output to both the system controller 11 and the engine controller 1.

<Overcurrent Determination Level>

Figure 4:
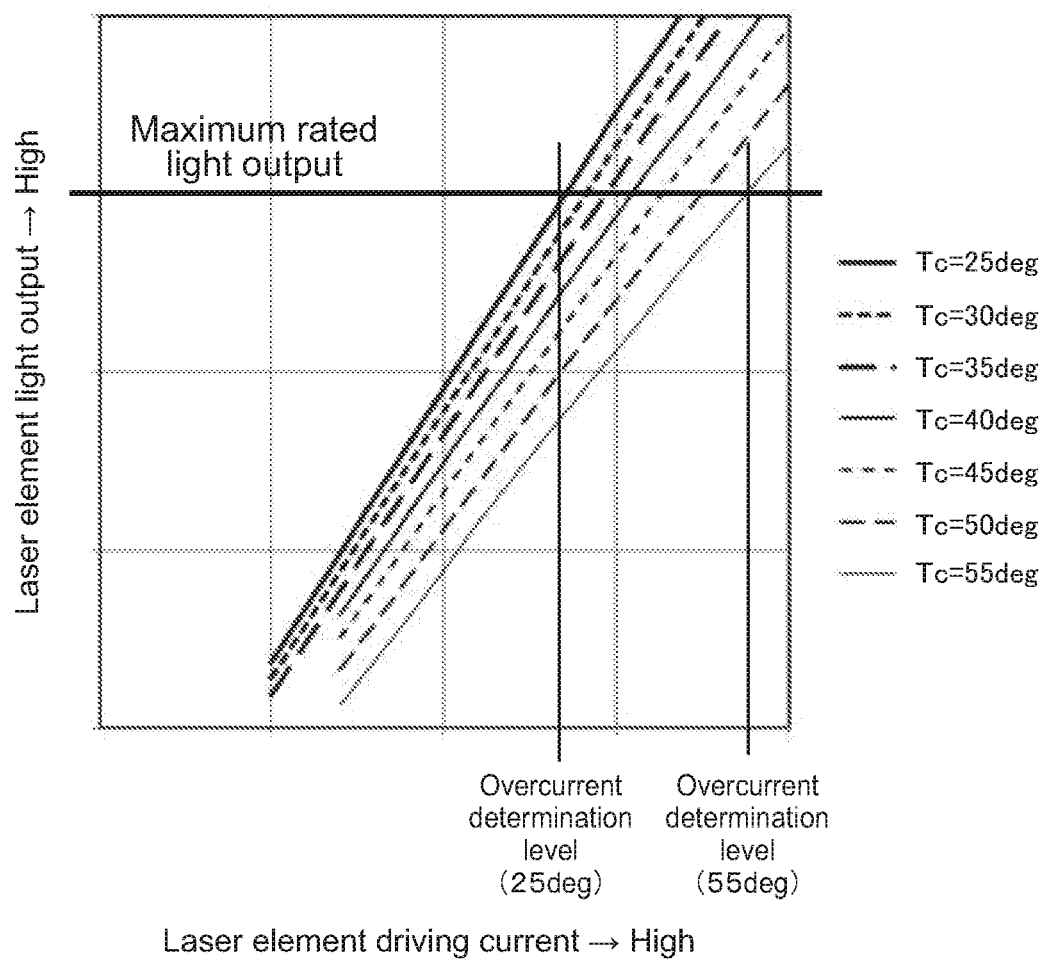
FIG. 4 A diagram showing how a relationship between a driving current value of a laser element and intensity of light of the laser element changes depending on the temperature around the laser element.

Next, the overcurrent determination level will be described in detail. FIG. 4 is a diagram showing how the relationship between the driving current value of the laser element 5 and the intensity of light of the laser element 5 changes depending on the temperature around the laser element 5. In FIG. 4, the horizontal axis indicates the driving current value of the laser element 5 and the vertical axis indicates the intensity of light of the laser element 5 (note that any units can be employed for these units).

FIG. 4 shows a relationship between the driving current of the laser element 5 and the intensity of light of the laser element 5 when the temperature Tc around the laser element 5 is changed to 25° C., 30° C., 40° C., 45° C., 50° C., and 55° C.

As shown in FIG. 4, in a case where the temperature Tc around the laser element 5 is relatively low, it is possible to output intense light from the laser element 5 even if the driving current value of the laser element 5 is small. On the other hand, in a case where the temperature Tc around the laser element 5 is relatively high, it is impossible to output intense light from the laser element 5 without increasing the driving current value of the laser element 5.

That is, in a case of supplying the same driving current value, when the temperature Tc around the laser element 5 increases, the intensity of light of the laser element 5 accordingly decreases.

In FIG. 4, the vertical axis (the intensity of light of the laser element 5) indicates the value of a maximum rated light output. This maximum rated light output indicates a maximum level at which the laser element 5 can be made to emit light stably and continuously.

When the intensity of light of the laser element 5 exceeds this maximum rated light output, the laser element 5 may be damaged. Further, it may also adversely affect user's eyes.

Therefore, the situation where light having intensity that exceeds the maximum rated light output is output from the laser element 5 should be avoided. In the present embodiment, the overcurrent determination level is set on the basis of such a consideration. That is, the overcurrent determination level is set on the basis of the maximum rated light output.

As shown in FIG. 4, when the temperature Tc is 25° C., light having intensity that exceeds the maximum rated light output is output from the laser element 5 if the driving current value of the laser element 5 exceeds a predetermined value. When the temperature Tc is 25° C., assuming that the driving current value when the light having the intensity corresponding to the maximum rated light output is output is the value of the overcurrent determination level, the light having the intensity that exceeds the maximum rated light output can be prevented from being output.

Further, as shown in FIG. 4, when the temperature Tc is 55° C., the light having the intensity that exceeds the maximum rated light output is output from the laser element 5 if the driving current value of the laser element 5 exceeds the predetermined value. When the temperature Tc is 55° C., assuming that the driving current value when the light having the intensity corresponding to the maximum rated light output is output is the value of the overcurrent determination level, the light having the intensity that exceeds the maximum rated light output can be prevented from being output.

As will be understood from this description, the value of the overcurrent determination level is different for each temperature Tc around the laser element 5 (is changed depending on the temperature Tc). Further, the value of the overcurrent determination level is changed to increase as the temperature Tc around the laser element 5 increases.

A relationship between such a value of the overcurrent determination level and the temperature Tc around the laser element 5 is tabulated in advance. The system controller 11 (or the engine controller 1) obtains information about a temperature around the laser element 5 at the present time, the temperature being detected by a temperature sensor provided around the laser element 5.

Then, the system controller 11 or the engine controller 1 refers to the table to determine the value of the overcurrent determination level corresponding to this temperature. Then, the system controller 11 (or the engine controller 1) inputs this value of the overcurrent determination level (value converted into voltage value) to the non-inverting input (+) of the comparator 41 in the comparison circuit 40 (see FIG. 3).

Accordingly, when the driving current that exceeds the overcurrent determination level flows into the laser element 5, i.e., when the laser element 5 emits light at an intensity that exceeds the maximum rated light output, a low-level signal (NG signal: detection signal indicating that the overcurrent has been detected) is output from the comparator 41.

Figure 5:
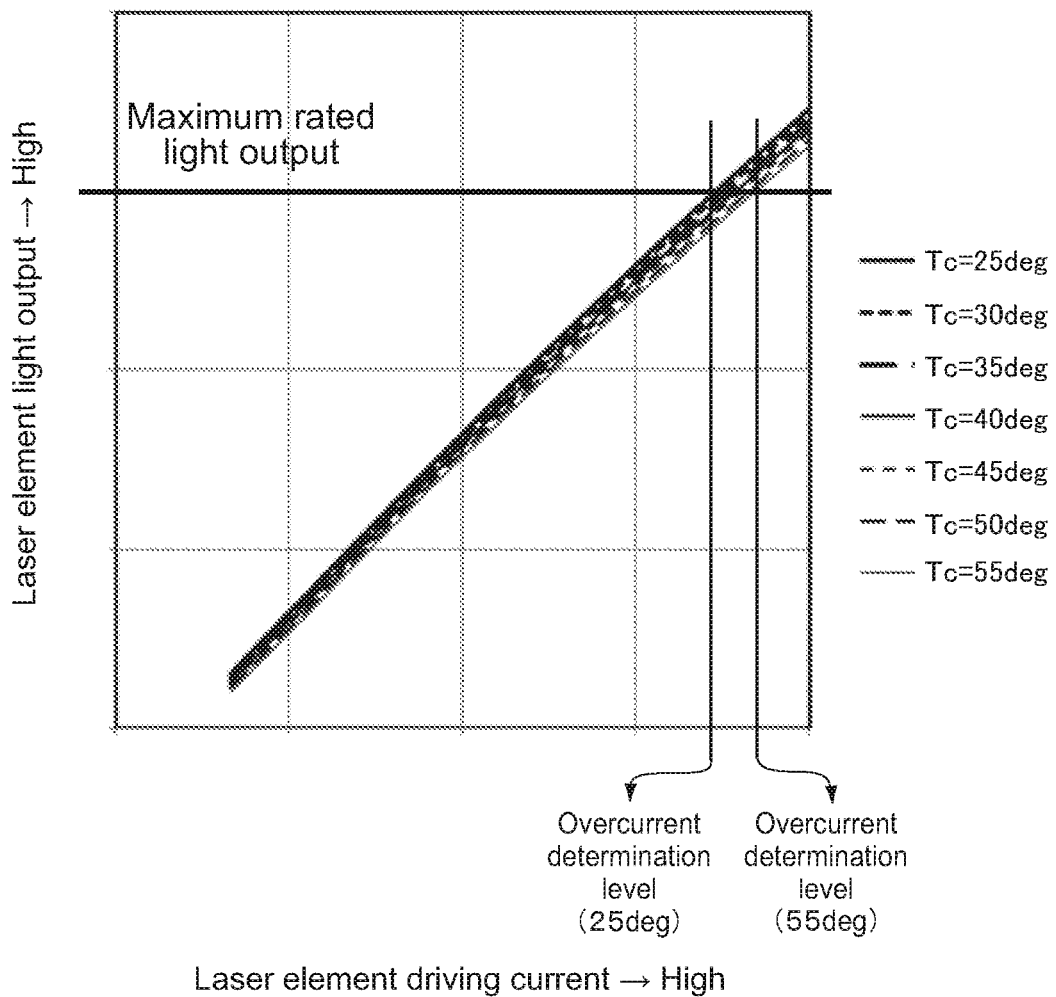
FIG. 5 A diagram showing another example regarding how a relationship between the driving current value of the laser element and the intensity of light of the laser element changes depending on the temperature around the laser element.

FIG. 5 is a diagram showing another example regarding how a relationship between the driving current value of the laser element 5 and the intensity of light of the laser element 5 changes depending on the temperature around the laser element 5.

In FIGS. 4 and 5, the type of the laser element 5 is different and the laser elements 5 are capable of emitting light in different wavelength regions, respectively. FIG. 4 shows an example in a case where the relationship between the driving current of the laser element 5 and the intensity of light of the laser element 5 relatively largely changes depending on the temperature. On the other hand, FIG. 5 shows an example in a case where the relationship between the driving current of the laser element 5 and the intensity of light of the laser element 5 does not much change with respect to the temperature.

Also in FIG. 5, the overcurrent determination level is set on the basis of a consideration similar to that of FIG. 4. In a case of FIG. 5, a difference in the overcurrent determination level for each temperature is smaller than that of FIG. 4. It should be noted that as in FIG. 5, in a case where the relationship between the driving current of the laser element 5 and the intensity of light of the laser element 5 does not much change with respect to temperature, the value of the overcurrent determination level may be constant irrespective of the temperature (in this case, the temperature sensor can be omitted).

Here, a case where how the relationship between the driving current value of the laser element 5 and the intensity of light of the laser element 5 changes depending on the temperature around the laser element 5 is different in each of the three laser elements 5 is assumed.

In such a case, a table showing a relationship between the value of the overcurrent determination level and the temperature Tc around the laser element 5 may be separately prepared in each of the three overcurrent determination circuits 6. That is, a first table used for the first overcurrent determination circuit 6a, a second table used for the second overcurrent determination circuit 6b, and a third table used for the third overcurrent determination circuit 6c may be prepared. It should be noted that in these three tables, a relationship between the temperature and the overcurrent determination level is different.

In this case, the system controller 11 (or the engine controller 1) refers to the first table to determine the value of the overcurrent determination level corresponding to the temperature around the first laser element 5a. Then, the system controller 11 (or the engine controller 1) inputs this value of the overcurrent determination level (value converted into voltage value) into the non-inverting input (+) of the comparator 41 in the first comparison circuit 40a (see FIG. 3).

Similarly, the system controller 11 (or the engine controller 1) refers to the second table to determine the value of the overcurrent determination level corresponding to the temperature around the second laser element 5b. Then, the system controller 11 (or the engine controller 1) inputs the value of the overcurrent determination level (value converted into voltage value) into the non-inverting input (+) of the comparator 41 in the second comparison circuit 40.

Similarly, the system controller 11 (or the engine controller 1) refers to the third table to determine the value of the overcurrent determination level corresponding to the temperature around the third laser element 5c. Then, the system controller 11 (or the engine controller 1) inputs the value of the overcurrent determination level (value converted into voltage value) into the non-inverting input (+) of the comparator 41 in the third comparison circuit 40.

In this case, the values of the overcurrent determination levels to be input into the first comparator circuit 40a, the second comparator circuit 40, and the third comparator circuit 40 are different from one another.

<Overshoot>

Next, the overshoot in the driving current value of the laser element 5. Here, the overshoot means deflection in the positive direction (ringing) when the pulsed driving current is supplied to the laser element 5 and the pulse rises. Such overshoot may occur, for example, in a case where the characteristic abnormality of the laser element 5 occurs or due to a change in the impedance of the current transfer system or the like.

Figure 6:
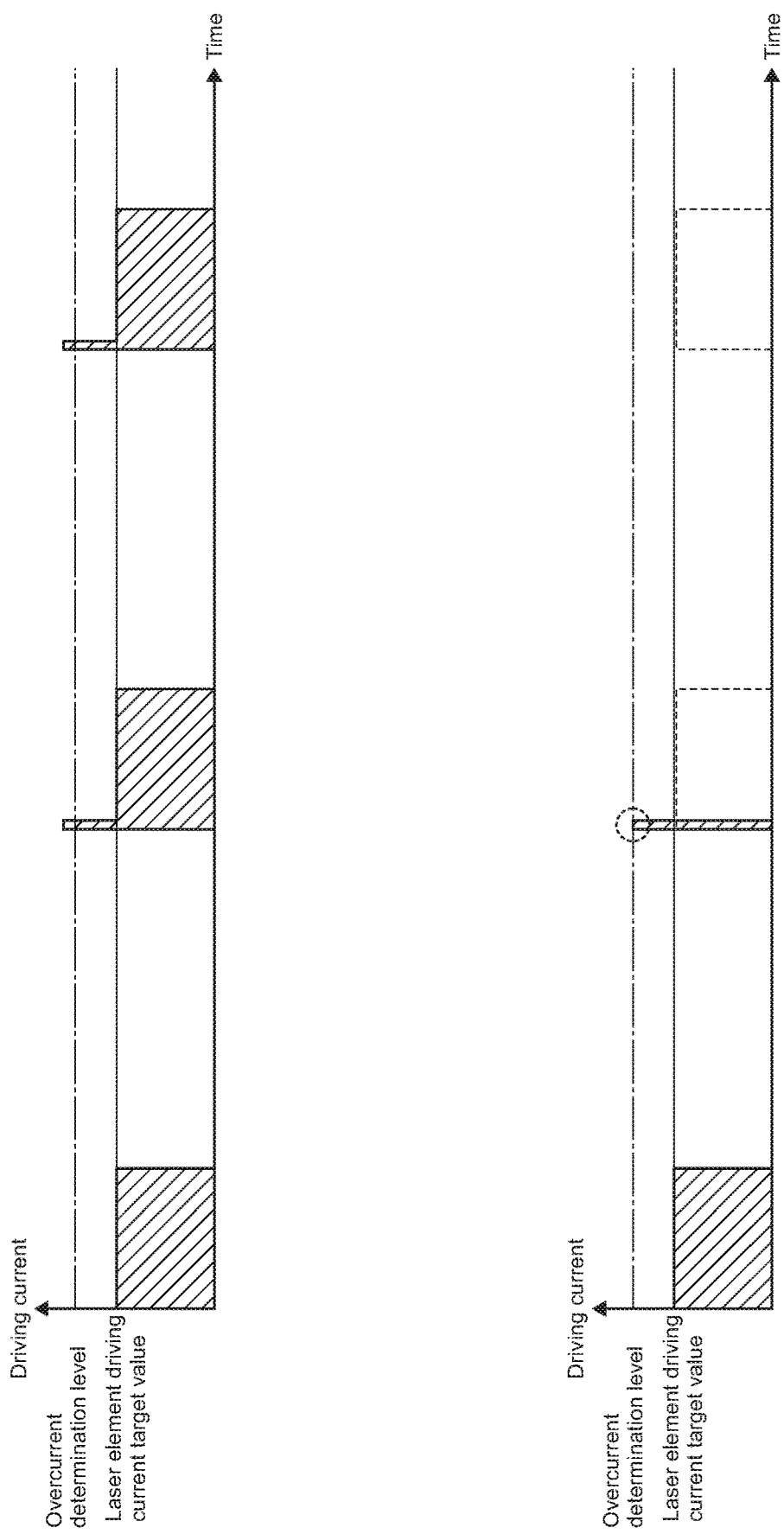
FIG. 6 A diagram showing overshoot at the driving current value of the laser element.

FIG. 6 is a diagram showing overshoot in the driving current value of the laser element 5. The upper side of FIG. 6 shows a state in a case where the overshoot occurs and the lower side of FIG. 6 shows a state of the driving current in a case where the overshoot occurs.

Referring to the upper side of FIG. 6, it is assumed that the overshoot occurs in the driving current value of the laser element 5 and the driving current value thus exceeds the value of the overcurrent determination level. At the moment when the driving current value exceeds the value of the overcurrent determination level due to the overshoot, a low-level signal (NG signal: detection signal indicating that the overcurrent has been detected) is output from the output terminal of the comparator 41 in the comparison circuit 40.

In this case, the low-level signal (NG signal) is input into one input terminal of the AND circuit 51 of the signal output circuit 50. Therefore, a low-level signal (function disable signal: stop signal for stopping the driving of the first laser element 5a) is output to the driving circuit 4 from the output terminal of the AND circuit 51.

The driving circuit 4 immediately stops the driving of the laser element 5 on the basis of this low-level signal. Accordingly, as shown on the lower side of FIG. 6, after the moment when the overcurrent based on the overshoot of the driving current flows, the driving current is not supplied to the laser element 5.

That is, in the present embodiment, the comparison circuit 40 is capable of determining not only whether the normal overcurrent (e.g., in a case where the overall pulsed driving current exceeds the overcurrent determination level) has flowed but also whether the overcurrent based on the overshoot has flowed.

It should be noted that in FIG. 6, the case where the driving current value exceeds the value of the overcurrent determination level due to the occurrence of overshoot has been described. On the other hand, an operation similar to the above-mentioned operation is performed also in a case where the driving current value exceeds the value of the overcurrent determination level due to the normal overcurrent. That is, in a case where the overall pulsed driving current value exceeds the overcurrent determination level, the driving of the laser element 5 is immediately stopped at the moment when the driving current value exceeds the overcurrent determination level.

<Effects, Etc.>

As described above, the overcurrent determination circuit 6 according to the present embodiment includes the sample-and-hold circuit 30 that obtains the driving current value of the laser element 5 in accordance with a timing of a light emitting interval of the laser element 5 that emits pulsed light and the comparator circuit 40 that compares the obtained driving current value with the value of the overcurrent determination level and determines whether the overcurrent has flowed in the laser element 5.

Accordingly, even in a case where the laser element 5 is driven by the pulse driving method, it is possible to appropriately determine whether overcurrent has flowed in the laser element 5. Further, in the present embodiment, the overcurrent determination circuit 6 is realized by a simple circuit configuration, and thus the cost can be reduced.

Further, in the present embodiment, the value of the overcurrent determination level is changed depending on the temperature around the laser element 5. Accordingly, the value of the overcurrent determination level can be appropriately changed depending on the temperature. As a result, whether the overcurrent has flowed in the laser element 5 can be determined with high accuracy irrespective of the temperature of the laser element 5.

Further, in the present embodiment, the value of the overcurrent determination level is changed to increase as the temperature around the laser element 5 increases. Accordingly, the value of the overcurrent determination level can be more appropriately changed depending on the temperature. As a result, whether the overcurrent has flowed in the laser element 5 can be determined with higher accuracy irrespective of the temperature of the laser element 5.

Further, in the present embodiment, the value of the overcurrent determination level is set in accordance with the maximum rated light output of the laser element 5. Accordingly, the value of the overcurrent determination level can be set to an appropriate value.

Further, in the present embodiment, not only whether the normal overcurrent has flowed, but also whether the overcurrent based on the overshoot has flowed can be determined. Accordingly, the overcurrent based on the overshoot can also be appropriately determined.

Further, in the present embodiment, in a case where it is determined by the comparison circuit 40 that the overcurrent has flowed in the laser element 5 (when a low-level signal (NG signal) is output from the output terminal of the comparator 41, the driving of the laser element 5 is stopped. Accordingly, the driving of the laser element 5 can be appropriately stopped in accordance with detection of the overcurrent. As a result, it is possible to appropriately prevent the laser element 5 from being damaged or the user's eyes from being adversely affected.

In particular, in the present embodiment, in a case where it is determined by the comparison circuit 40 that the overcurrent the overcurrent has flowed in the laser element 5 (when a low-level signal (NG signal) is output from the output terminal of the comparator 41), the driving of the laser element 5 by the driving circuit 4 is immediately stopped. Owing to such an immediate response, it is possible to prevent excessive overcurrent from flowing in the laser element 5.

Further, the overcurrent determination circuit 6 according to the present embodiment further includes the signal output circuit 50. When at least one signal of the detection signal (low-level signal (NG signal)) of the overcurrent output from the comparator circuit 40 and the stop control signal (low-level signal (function disable signal)) output from the controller (system controller 11 or engine controller 1) is input, this signal output circuit 50 outputs a stop signal for stopping the driving of the laser element 5 (low-level signal (function disable signal)) to the driving circuit 4.

Accordingly, including both a stop instruction as a determination result of the overcurrent and a stop instruction from the controller, the stop instruction can be performed on the driving circuit 4.

Further, the overcurrent determination circuit 6 according to the present embodiment further includes the common signal output circuit 60. When at least one signal of the first detection signal of the overcurrent output from the first comparison circuit 40a (low-level signal (NG signal)), the second detection signal of the overcurrent output from the second comparison circuit 40 (low-level signal (NG signal)), and the third detection signal of the overcurrent output from the third comparison circuit 40 (low-level signal (NG signal)) is input, this common signal output circuit 60 outputs a signal indicating that overcurrent has been detected in at least one laser element 5 to the controller (system controller 11 or engine controller 1).

Accordingly, it is possible for the system controller (or the engine controller 1) to recognize that overcurrent has been detected in the at least one laser element 5. Based on this recognition, the system controller 11 (or the engine controller 1) is capable of performing, for example, processing of restarting (resetting) the entire system or the like.

Further, the overcurrent determination circuit 6 according to the present embodiment is an independent circuit different from the controller (the system controller 11 or the engine controller 1). Accordingly, even if the controller has malfunctioned, the overcurrent determination circuit 6 is capable of independently performing determination of the overcurrent and independently stopping the driving of the laser element 5 by the driving circuit 4.

Next, a case where the APC system has failed in a case where the projector 100 does not include the overcurrent determination circuit 6 but includes the APC system will be assumed as a comparative example. In this case, there is a possibility that overcurrent may flow in the laser element 5 because the system that controls the intensity of light of the laser element 5 does not work.

In particular, in recent years, the projector 100 with a higher luminance is desired from the market demand, and in such a projector 100, the power supply capability of the power supply system is set to be high. Therefore, if the APC fails, unexpected overcurrent flows into the laser element 5 for a long time, and in the worst case, the laser element 5 may be damaged. Further, it may adversely affect the user's eyes.

On the other hand, in the present embodiment, since the overcurrent determination circuit 6 is provided, it is possible to appropriately determine the overcurrent and to stop the driving of the laser element 5 by the driving circuit 4 even if the APC system has failed.

In particular, in the present embodiment, in a case where the power supply capability of the power supply system is set to be high, it is possible to appropriately prevent unexpected overcurrent from flowing into the laser element 5 for a long time. As a result, it is possible to appropriately prevent the laser element 5 from being damaged or the user's eye from being adversely affected.

Next, a case where the driving current value of the laser element 5 is sampled at several points and set as a current representative value and the overcurrent is determined on the basis of this current representative value will be assumed as a comparative example.

Figure 7:
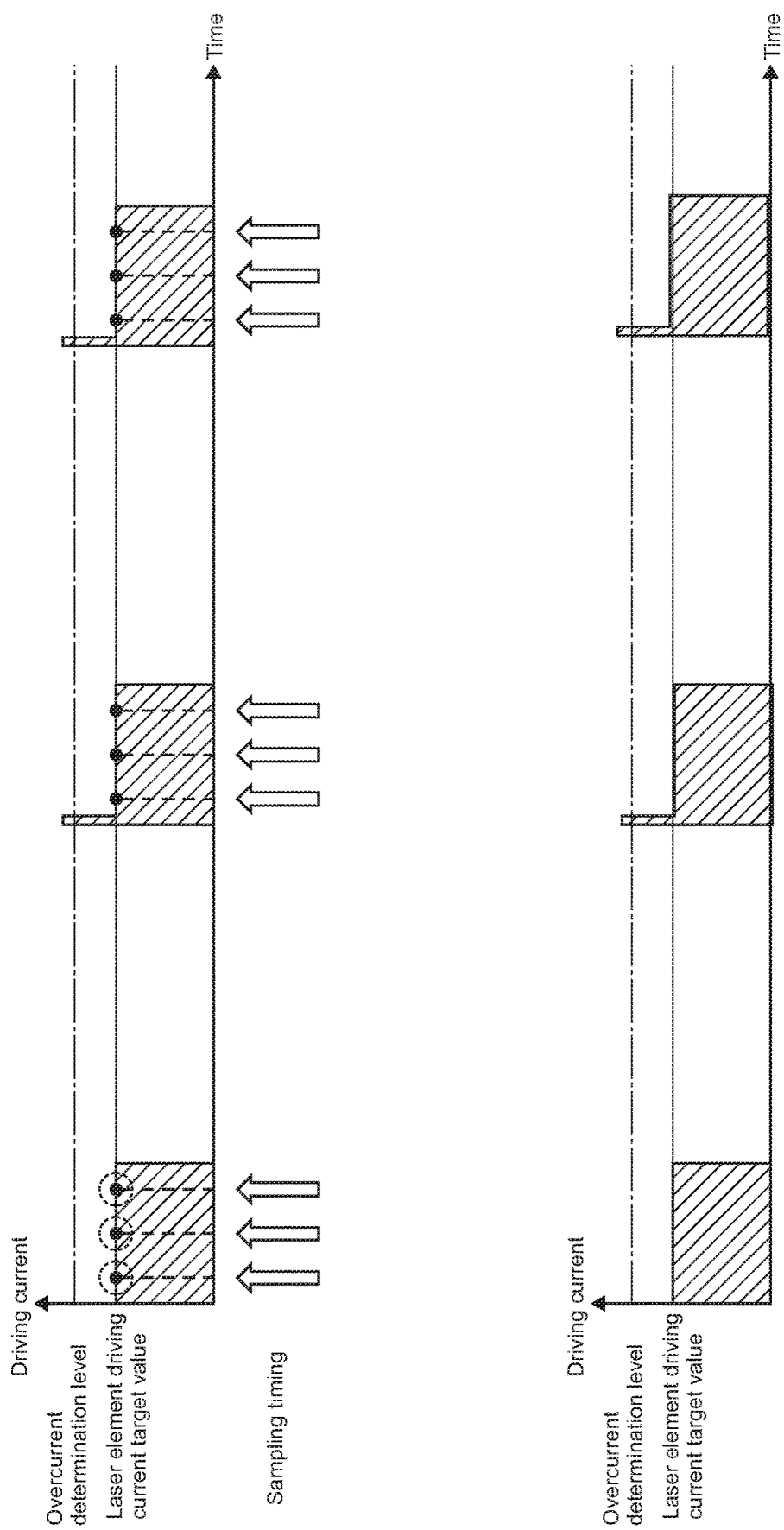
FIG. 7 A diagram showing a comparative example in a case where the driving current value of the laser element is sampled at a plurality of points and set as a current representative value and overcurrent is determined on the basis of this current representative value.

FIG. 7 is a diagram showing a comparative example in a case where the driving current value of the laser element 5 is sampled at several points and set as a current representative value and overcurrent is determined on the basis of this current representative value. The upper side of FIG. 7 shows a state when the driving current value is sampled. On the other hand, the lower side of FIG. 7 shows the state of the driving current of the laser element 5 in a case where the overcurrent is determined by this method.

In the comparative example, in one light emitting interval in the laser element 5, for example, sampling of the driving current value is performed at three points, for example, and the driving current value at this three points is set as a current value representative. Then, it is determined whether this representative current value exceeds the overcurrent determination level.

As shown on the upper side of FIG. 7, in a case of this method, if the sampling is performed at a timing deviated from the timing of the overshoot, it is impossible to recognize that the overshoot exceeds the overcurrent determination level.

In this case, as shown on the lower side of FIG. 7, the driving of the laser element 5 by the driving circuit 4 continues. As a result, the laser element 5 is damaged. Further, it adversely affects the user's eyes.

On the other hand, in the present embodiment, as described above, at the moment when the driving current value exceeds the value of the overcurrent determination level due to overshoot, the driving of the laser element 5 is immediately stopped (see FIG. 6). That is, in the case of the present embodiment, even in local overcurrent such as overshoot, it is possible to appropriately determine such local overcurrent and immediately stop driving of the laser element 5.

Next, a case where driving current values of the laser element 5 are averaged and the overcurrent is determined on the basis of this average value will be assumed as a comparative example. In this case, there is a possibility that local overcurrent such as overshoot may be missed due to the averaging.

In addition, in a case of this comparative example, since the calculation time for averaging the driving current values is taken, the time until the driving of the laser element 5 by the driving circuit 4 is stopped is longer. In this case, even if the driving of the laser element 5 is stopped, there is a possibility that the laser element 5 may have been damaged and destroyed.

On the other hand, in the present embodiment, since the driving of the laser element 5 is stopped immediately the moment when the driving current value exceeds the value of the overcurrent determination level as described above, it is possible to appropriately prevent the laser from being damaged.

Various Modified Examples

In the above description, the laser element 5 has been described as an example of the light emitting element. On the other hand, the light emitting element may be a light emitting diode (LED).

In the above description, the case in which the three light emitting elements (laser elements 5) are made to emit light at timings different from each other (time division emission) has been described. On the other hand, the present technology can also be applied to a case where two or more of the three light emitting elements are made to emit light at the same time (simultaneous light emission). For example, even if the three light emitting elements that output light in the wavelength regions of red, green, and blue emit light at the same timing, the three light emitting elements only need to each output light having intensity to take white balance. Assuming that this is defined as a white region, a hue component cannot be expected in this white region, though the brightness becomes higher as compared to the time division light emission.

Further, in the above description, the case where the overcurrent determination circuit 6 according to the present technology is applied to the projector 100 has been described. On the other hand, any apparatus can be applied as the overcurrent determination circuit 6 according to the present technology as long as it is an apparatus including a light emitting element (typically, the pulse driving method).

The present technology can also take the following configurations.

(1) An overcurrent determination circuit, including:
   a sample-and-hold circuit that obtains a driving current value of a light emitting element in accordance with a timing of a light emitting interval of the light emitting element that emits pulsed light; and
   a comparator circuit that compares the obtained driving current value with a value of a predetermined determination level and determines whether overcurrent has flowed in the light emitting element.

(2) The overcurrent determination circuit according to (1), in which
   the value of the determination level is changed depending on a temperature around the light emitting element.

(3) The overcurrent determination circuit according to (2), in which
   the value of the determination level is changed such that the value becomes higher as the temperature becomes higher.

(4) The overcurrent determination circuit according to any one of (1) to (3), in which
   the value of the determination level is set in accordance with a maximum rated light output of the light emitting element.

(5) The overcurrent determination circuit according to any one of (1) to (4), in which
   the comparator circuit determines whether overcurrent based on overshoot of the driving current has flown by the comparison.

(6) The overcurrent determination circuit according to any one of (1) to (5), in which
driving of the light emitting element is stopped in a case where it is determined by the comparator circuit that the overcurrent has flowed in the light emitting element.

(7) The overcurrent determination circuit according to any one of (1) to (6), in which
   the comparator circuit outputs, in a case where it is determined that the overcurrent has flowed in the light emitting element, a detection signal indicating that the overcurrent has been detected.

(8) The overcurrent determination circuit according to (7), further including
   a signal output circuit that outputs, when at least one signal of the detection signal output from the comparator circuit and a stop control signal for stopping driving of the light emitting element is input, a stop signal for stopping driving of the light emitting element to a driving circuit that drives the light emitting element, the stop control signal being output from a controller that performs processing related to light emission control.

(9) The overcurrent determination circuit according to any one of (1) to (8), in which
   the light emitting element includes a first light emitting element and a second light emitting element that output light in wavelength regions different from each other and emit light at timings different from each other, the overcurrent determination circuit including
   a first overcurrent determination circuit corresponding to the first light emitting element and a second overcurrent determination circuit corresponding to the second light emitting element.

(10) The overcurrent determination circuit according to (9), in which
   the first overcurrent determination circuit includes
      a first sample-and-hold circuit that obtains a driving current value of the first light emitting element in accordance with a timing of a light emitting interval of the first light emitting element and
      a first comparator circuit that compares the obtained driving current value with the value of the determination level and determines whether overcurrent has flowed in the first light emitting element.

(11) The overcurrent determination circuit according to (10), in which
   the second overcurrent determination circuit includes
      a second sample-and-hold circuit that obtains a driving current value of the second light emitting element in accordance with a timing of a light emitting interval of the second light emitting element and
      a second comparator circuit that compares the obtained driving current value with the value of the determination level and determines whether overcurrent has flowed in the second light emitting element.

(12) The overcurrent determination circuit according to (11), in which
   the first comparator circuit outputs, in a case where it is determined that the overcurrent has flowed in the first light emitting element, a first detection signal indicating that the overcurrent has been detected, and
   the second comparator circuit outputs, in a case where it is determined that the overcurrent has flowed in the second light emitting element, a second detection signal indicating that the overcurrent has been detected.

(13) The overcurrent determination circuit according to (12), further including
   a signal output circuit that outputs, when at least one signal of the first detection signal and the second detection signal is input, a signal indicating that the overcurrent has been detected in at least one light emitting element to a controller that performs processing related to light emission control.

(14) The overcurrent determination circuit according to any one of (1) to (13), in which
   the overcurrent determination circuit is configured as an independent circuit different from a controller that performs processing related to light emission control.

(15) A light emission control apparatus, including:
a light emitting element that emits pulsed light; and
an overcurrent determination circuit including
a sample-and-hold circuit that obtains a driving current value of the light emitting element in accordance with a timing of a light emitting interval of the light emitting element and
a comparator circuit that compares the obtained driving current value with a value of a predetermined determination level and determines whether overcurrent has flowed in the light emitting element.

REFERENCE SIGNS LIST 1 engine controller
4 driving circuit
5 laser element
6 overcurrent determination circuit
11 system controller
30 sample-and-hold circuit
40 comparator circuit
50 signal output circuit
60 common signal output circuit
100 projector

The invention claimed is:

1. A light emission control apparatus, comprising:
a light emitting element configured to emit pulsed light, wherein the light emitting element comprises:
a first light emitting element and a second light emitting element that are configured to output light in wavelength regions different from each other and emit light at timings different from each other; and
an overcurrent determination circuit comprising:
a first overcurrent determination circuit corresponding to the first light emitting element and a second overcurrent determination circuit corresponding to the second light emitting element,
wherein each overcurrent determination circuit comprises:
a sample-and-hold circuit configured to obtain a driving current value of the light emitting element in accordance with a timing of a light emitting interval of the light emitting element that emits the pulsed light, and
a comparator circuit configured to compare the obtained driving current value with a value of a predetermined determination level and determine whether overcurrent has flowed in the light emitting element.

2. The light emission control apparatus according to claim 1, wherein the value of the predetermined determination level is changed depending on a temperature around the light emitting element.

3. The light emission control apparatus according to claim 2, wherein the value of the predetermined determination level is changed such that the value becomes higher as the temperature becomes higher.

4. The light emission control apparatus according to claim 1, wherein the value of the predetermined determination level is set in accordance with a maximum rated light output of the light emitting element.

5. The light emission control apparatus according to claim 1, wherein the comparator circuit is further configured to determine whether the overcurrent based on overshoot of a driving current has flown by the comparison.

6. The light emission control apparatus according to claim 1, wherein driving of the light emitting element is stopped in a case where it is determined by the comparator circuit that the overcurrent has flowed in the light emitting element.

7. The light emission control apparatus according to claim 1, wherein the comparator circuit is further configured to output, in a case where it is determined that the overcurrent has flowed in the light emitting element, a detection signal indicating that the overcurrent has been detected.

8. The light emission control apparatus according to claim 7, further comprising a signal output circuit configured to output, when at least one signal of the detection signal output from the comparator circuit and a stop control signal for stopping driving of the light emitting element is input, a stop signal for stopping the driving of the light emitting element to a driving circuit that drives the light emitting element, the stop control signal being output from a controller that performs processing related to light emission control.

9. The light emission control apparatus according to claim 1, wherein the first overcurrent determination circuit includes a first sample-and-hold circuit configured to obtain a driving current value of the first light emitting element in accordance with a timing of a light emitting interval of the first light emitting element and a first comparator circuit configured to compare the obtained driving current value with the value of the determination level and determines whether overcurrent has flowed in the first light emitting element.

10. The light emission control apparatus according to claim 9, wherein the second overcurrent determination circuit includes a second sample-and-hold circuit configured to obtain a driving current value of the second light emitting element in accordance with a timing of a light emitting interval of the second light emitting element and a second comparator circuit configured to compare the obtained driving current value with the value of the predetermined determination level and determines whether overcurrent has flowed in the second light emitting element.

11. The light emission control apparatus according to claim 10, wherein the first comparator circuit is further configured to outputs, in a case where it is determined that the overcurrent has flowed in the first light emitting element, a first detection signal indicating that the overcurrent has been detected, and the second comparator circuit is further configured to output, in a case where it is determined that the overcurrent has flowed in the second light emitting element, a second detection signal indicating that the overcurrent has been detected.

12. The light emission control apparatus according to claim 11, further comprising a signal output circuit configured to output, when at least one signal of the first detection signal and the second detection signal is input, a signal indicating that the overcurrent has been detected in at least one light emitting element to a controller that performs processing related to light emission control.

13. The light emission control apparatus according to claim 1, wherein the overcurrent determination circuit is configured as an independent circuit different from a controller that performs processing related to light emission control.

* * * * *